United States Patent
Sonehara

(10) Patent No.: US 9,437,601 B1
(45) Date of Patent: Sep. 6, 2016

(54) SEMICONDUCTOR DEVICE

(71) Applicant: Kabushiki Kaisha Toshiba, Minato-ku (JP)

(72) Inventor: Takeshi Sonehara, Yokkaichi (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/848,946

(22) Filed: Sep. 9, 2015

Related U.S. Application Data

(60) Provisional application No. 62/189,999, filed on Jul. 8, 2015.

(51) Int. Cl.
*H01L 27/11* (2006.01)
*H01L 27/115* (2006.01)
*H01L 29/49* (2006.01)

(52) U.S. Cl.
CPC ... *H01L 27/11521* (2013.01); *H01L 27/11556* (2013.01); *H01L 27/11568* (2013.01); *H01L 27/11582* (2013.01); *H01L 29/4925* (2013.01)

(58) Field of Classification Search
CPC .............. H01L 27/11521; H01L 27/11568; H01L 27/11582; H01L 27/11556; H01L 29/4925
See application file for complete search history.

(56) References Cited

U.S. PATENT DOCUMENTS

| | | | |
|---|---|---|---|
| 2013/0075742 A1* | 3/2013 | Ohsawa | H01L 21/28282 257/66 |
| 2013/0181275 A1 | 7/2013 | Kobayashi et al. | |
| 2013/0240970 A1 | 9/2013 | Kondo et al. | |

FOREIGN PATENT DOCUMENTS

JP 2013-069953 4/2013

* cited by examiner

*Primary Examiner* — Roy Potter
*Assistant Examiner* — Paul Patton
(74) *Attorney, Agent, or Firm* — Oblon, McClelland, Maier & Neustadt, L.L.P.

(57) ABSTRACT

A semiconductor device according to an embodiment includes a stacked body, and a semiconductor pillar. The stacked body includes first insulating layers and conductive layers. The conductive layer includes silicon. At least one of the conductive layers includes a first portion, a second portion, and a third portion. The first portion includes a first element selected from at least one of boron and phosphorus. The second portion includes the first element. The third portion is provided between the first portion and the second portion in a stacking direction of the conductive layers and the first insulating layers. The third portion includes a second element. The second element is selected from at least one of carbon, nitrogen, oxygen, and germanium. The semiconductor pillar pierces through the stacked body. The semiconductor pillar extends in the stacking direction.

14 Claims, 18 Drawing Sheets

SEMICONDUCTOR DEVICE

CROSS-REFERENCE TO RELATED APPLICATIONS

This application is based upon and claims the benefit of priority from U.S. Provisional Patent Application 62/189,999, filed on Jul. 8, 2015; the entire contents of which are incorporated herein by reference.

FIELD

Embodiments described herein relate generally to a semiconductor device.

BACKGROUND

A semiconductor device in which memory cells are three-dimensionally integrated has been proposed. The semiconductor device can be formed by alternately stacking insulating films and electrode films to form a stacked body, forming through-holes in the stacked body, forming memory films capable of accumulating electric charges on inner surfaces of the through-holes, and forming silicon pillars on the insides of the through-holes. According to this process, it is possible to form the memory cells between the silicon pillars and the electrode films.

In such a semiconductor device, improvement of writing speed is demanded.

DETAILED DESCRIPTION

Figure 1:
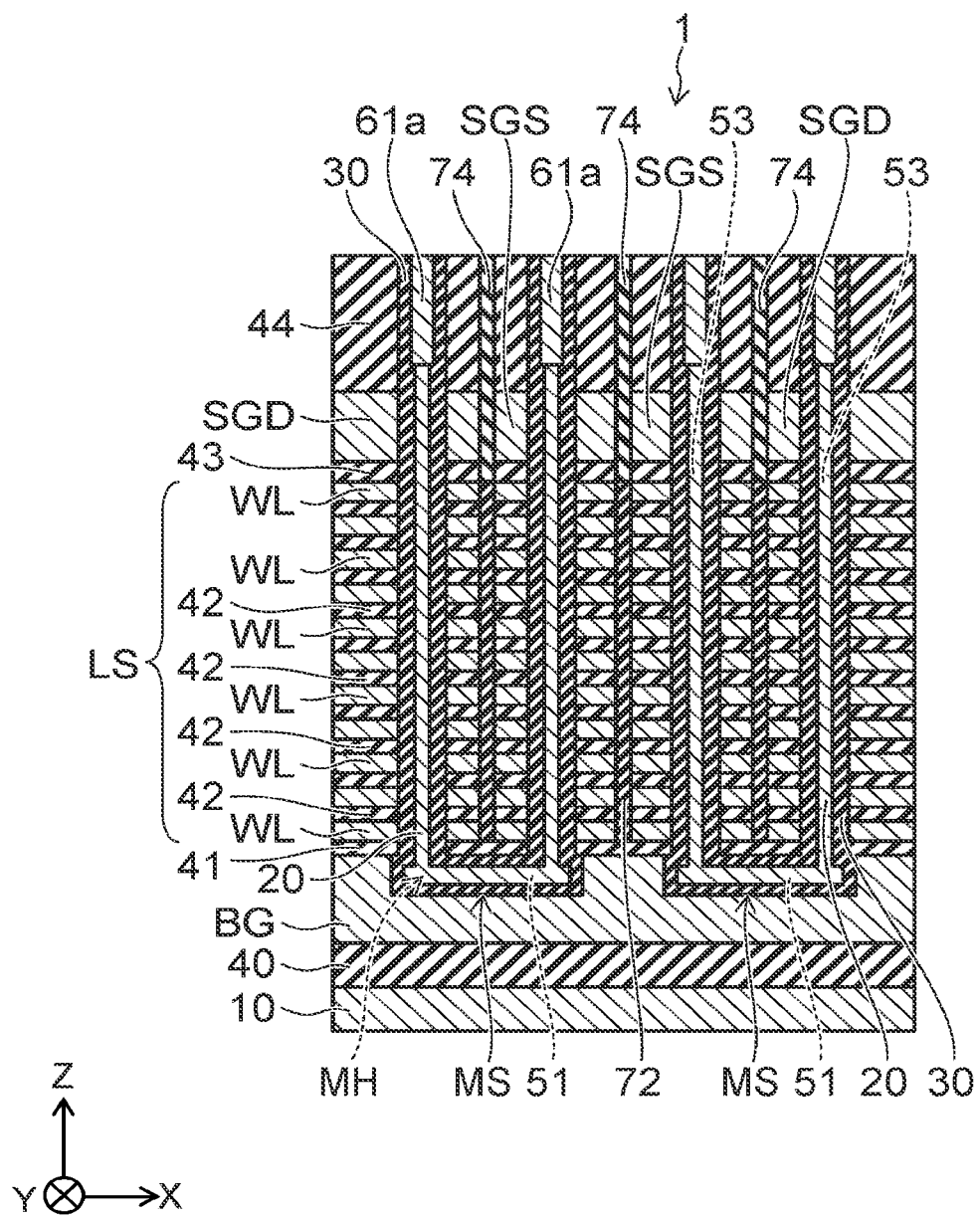
FIG. 1 is a sectional view of the semiconductor device 1 according to a first embodiment.

A semiconductor device according to an embodiment includes a stacked body, and a semiconductor pillar. The stacked body includes a plurality of first insulating layers and a plurality of conductive layers. The conductive layer includes silicon. The conductive layers and the first insulating layers are alternately provided. At least one of the conductive layers includes a first portion, a second portion, and a third portion. The first portion includes p-type or n-type impurities. The second portion includes the impurities. The third portion is provided between the first portion and the second portion in a stacking direction of the plurality of conductive layers and the plurality of first insulating layers. The third portion includes a first element. The first element is selected from at least one of carbon, nitrogen, oxygen, and germanium. The semiconductor pillar pierces through the stacked body. The semiconductor pillar extends in the stacking direction.

Embodiments of the invention are described below with reference to the drawings.

Note that, the drawings are schematic or conceptual. Relations between thicknesses and widths of portions, ratios of sizes among the portions, and the like are not always the same as real ones. Even when the same portions are shown, the portions are sometimes shown in different dimensions and ratios depending on the drawings.

Note that in the specification and the drawings, components described with reference to the drawings already referred to are denoted by the same reference numerals and signs. Detailed description of the components is omitted as appropriate.

In the description of the embodiments, an XYZ orthogonal coordinate system is used. Two directions parallel to the major surface of a substrate and orthogonal to each other are represented as an X-direction and a Y-direction. A direction orthogonal to both of the X-direction and the Y-direction is represented as Z-direction.

First Embodiment

A semiconductor device 1 according to a first embodiment is, for example, a nonvolatile semiconductor storage device that can electrically erasing and writing data and can retain stored content even if a power supply is turned off.

FIG. 1 is a sectional view of the semiconductor device 1 according to a first embodiment.

Figure 2:
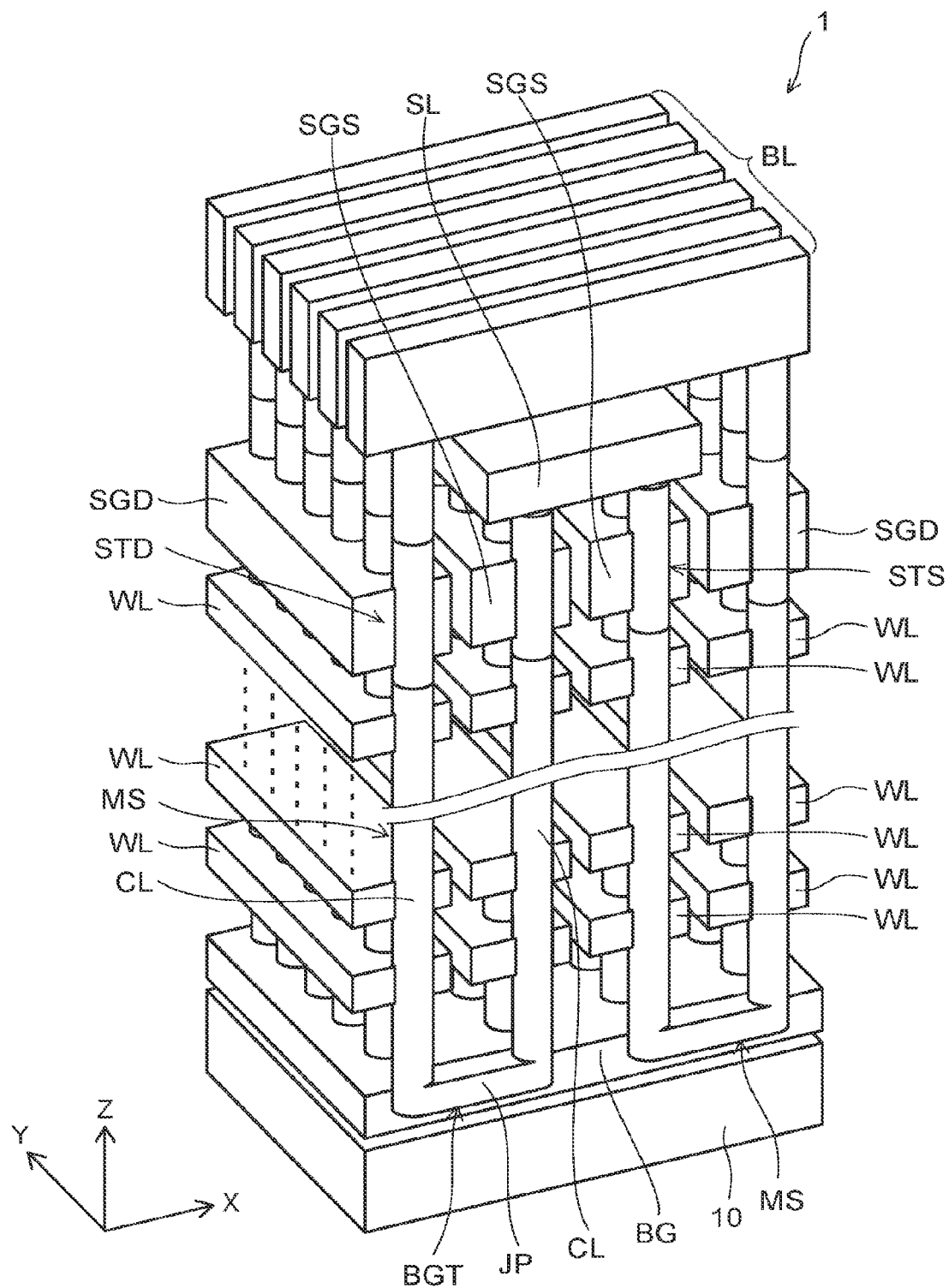
FIG. 2 is a perspective view of the semiconductor device 1 according to the first embodiment.

FIG. 2 is a perspective view of the semiconductor device 1 according to the first embodiment.

Figure 3:
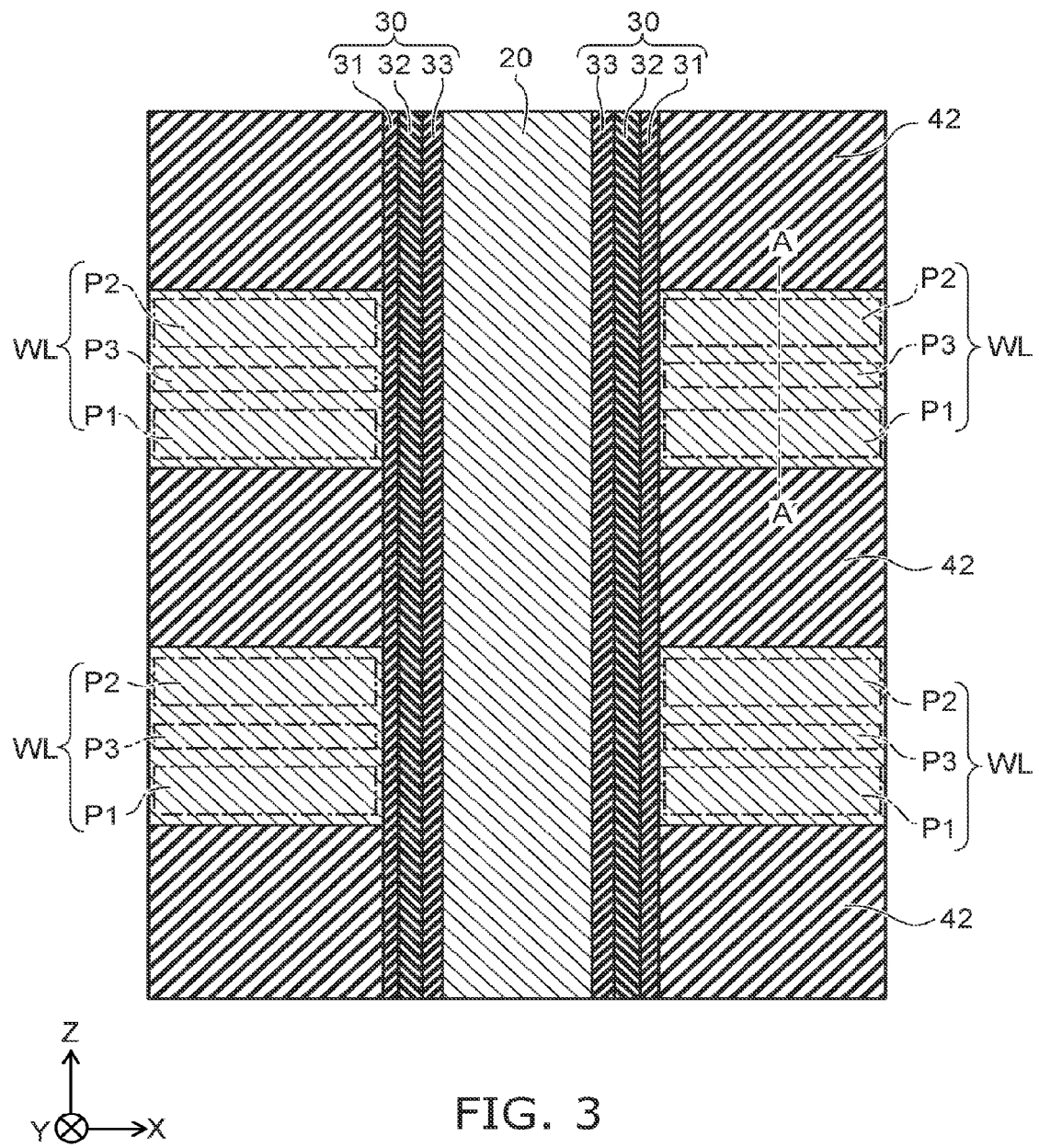
FIG. 3 is a partially enlarged sectional view of the semiconductor device 1 according to the first embodiment.

FIG. 3 is a partially enlarged sectional view of the semiconductor device 1 according to the first embodiment.

In FIG. 2, insulating portions are not shown to clearly show the figure.

As shown in FIG. 1, the semiconductor device 1 is provided, for example, on a substrate 10. An insulating layer 40 is provided on the substrate 10. A back gate BG is provided on the insulating layer 40. The back gate BG is a conductive layer and is, for example, a silicon layer added with impurities.

An insulating layer 41 is provided on the back gate BG. A stacked body LS, in which conductive layers WL and insulating layers 42 are alternately stacked, is provided on the insulating layer 41. An insulating layer 43 is provided on the stacked body LS including the conductive layers WL and the insulating layers 42. The number of conductive layers WL shown in FIG. 1 is just an example. The number of conductive layers WL is optional.

The conductive layers WL are polycrystalline silicon layers added with first element. The first element is selected from at least one of boron and phosphorus. The conductive layers WL have enough electric conductivity so that the conductive layers WL function as gate electrodes of memory cells. The insulating layers 41, 42, and 43 mainly contain, for example, silicon oxide. Or these insulating layers mainly contain, for example, silicon nitride.

As shown in FIG. 2, the semiconductor device 1 includes a plurality of memory strings MS. One memory string MS includes, for example, two columnar sections CL and a coupling section JP that couples respective lower ends of the two columnar sections CL.

The columnar sections CL extend in a stacking direction (the Z-direction) of the plurality of conductive layers WL and the plurality of insulating layers 42. The columnar sections CL pierce through the insulating layer 41, the plurality of conductive layers WL, the plurality of insulating layers 42, and the insulating layer 43.

The coupling section JP is provided in the back gate BG. The coupling section JP is, for example, connected between two columnar sections CL.

The memory strings MS may be configured only from the columnar sections CL. In this case, the columnar sections CL are provided such that the lower ends thereof are located in the back gate BG.

As shown in FIG. 1, a selection gate layer, which is a conductive layer, is provided on the insulating layer 43. The selection gate layer includes a drain side selection gate SGD and a source side selection gate SGS. Upper end portions of one columnar section CL in the memory string MS is connected to the drain side selection gate SGD. The upper end portion of the other columnar section CL is connected to the source side selection gate SGS.

The selection gate layer is, for example, a polycrystalline silicon layer added with impurities. The selection gate layer has enough electric conductivity so that the selection gate layer functions as a gate electrode of a selection transistor. The thickness of the selection gate layer is, for example, larger than the thickness of each of the conductive layers WL.

The drain side selection gate SGD and the source side selection gate SGS are divided in the X-direction by insulating layers 74. The conductive layer WL stacked under the drain side selection gate SGD and the conductive layer WL stacked under the source-side selection gate SGS are divided in the X-direction by the insulating layers 72. The stacked body among the memory strings MS adjacent to one another in the X-direction is also divided in the X-direction by the insulating layers 72.

An insulating layer 44 is provided on the source side selection gate SGS and the drain side selection gate SGD. A source line SL shown in FIG. 2 is provided on the insulating layer 44. The source line SL is electrically connected to the upper end of one columnar section CL that the source side selection gate SGS is connected.

A plurality of bit lines BL are provided on the drain side selection gate SGD and the source line SL via an insulating layer not shown. The bit line BL is electrically connected to the upper end of the other columnar section CL that the drain side selection gate SGD is connected.

The drain side selection gate SGD, a part of the semiconductor pillars 20, and a part of memory layers 30 configure a drain side selection transistor STD. The semiconductor pillars 20 are connected to the bit lines BL via conductors 61a on the drain side selection gate SGD. The conductors 61a are, for example, silicon layers doped with phosphorus.

The source side selection gate SGS, a part of the semiconductor pillars 20, and a part of the memory layers 30 configure a source side selection transistors STS. The semiconductor pillars 20 are connected to the source lines SL via the conductors 61a on the source side selection gate SGS.

The back gate BG, portions of the semiconductor pillars 20 provided in the back gate BG, and portions of the memory layers 30 provided in the back gate BG configure a back gate transistor BGT.

A plurality of memory cells including the conductive layers WL as control gates are formed between the drain side selection transistor STD and the back gate transistor BGT. Similarly, a plurality of memory cells including the conductive layers WL as control gates are also formed between the back gate transistor BGT and the source side selection transistor STS.

The plurality of memory cells, the drain side selection transistor STD, the back gate transistor BGT, and the source side selection transistor STS are connected in series through the semiconductor pillar 20 to configure one memory string MS. A plurality of memory strings MS are arrayed in the X-direction and the Y-direction, whereby the plurality of memory cells are three-dimensionally provided in the X-direction, the Y-direction, and the Z-direction.

Memory holes MH include grooves formed in the back gate BG and through-holes formed in the stacked body LS. The memory strings MS include the semiconductor pillars 20 and the memory layers 30. The semiconductor pillars 20 are provided in the memory holes MH. The memory layers 30 are provided between the semiconductor pillars 20 and the inner walls of the memory holes MH.

The semiconductor pillars 20 are made of, for example, non-doped silicon. Non-doped means that impurities for imparting electric conductivity to the silicon layers are intentionally not added and impurities are not substantially included other than elements due to a material gas during film formation.

The memory layer 30 includes, as shown in FIG. 3, a block layer 31, a charge storage layer 32, and a tunnel layer 33. Or a plurality of floating gate layers may be provided between the block layer 31 and the tunnel layer 33 instead of the charge storage layer 32. The tunnel layer 33 is provided between the stacked body LS and the semiconductor pillar 20. The charge storage layer 32 is provided between the stacked body LS and the tunnel layer 33. The block layer 31 is provided between the stacked body LS and the charge storage layer 32. The block layer 31 is provided, for example, in contact with the side surfaces of the plurality of conductive layers WL and the side surfaces of the plurality of insulating layers 42.

In an example shown in FIG. 3, the memory hole MH is filled with the semiconductor pillar 20 and the memory layer 30. However, a hollow section may be formed on the inner side of the semiconductor pillar 20 (the center axis side of the memory hole MH). Or an insulating section may be provided on the inner side of the semiconductor pillar 20.

The semiconductor pillar 20 functions as a region in which a channel is formed. The conductive layer WL functions as the control gate of the memory cell. The memory cell is, for example, a charge trap type. The charge storage layer 32 functions as a data memory layer that accumulates electric charges injected from the semiconductor pillar 20. That is, the memory cells having structure in which the control gates surround channels are formed in crossing portions of the semiconductor pillar 20 and the conductive layers WL.

The block layer 31 is an insulating layer. The block layer 31 prevents the electric charges accumulated in the charge storage layer 32 from diffusing to the conductive layers WL. The block layer 31 is, for example, a silicon oxide layer.

The charge storage layer 32 includes a large number of trap sites that capture electric charges. The charge storage layer 32 is, for example, a silicon nitride layer.

The tunnel layer 33 is an insulating layer. The tunnel layer 33 functions as a potential barrier when the electric charges are injected into the charge storage layer 32 from the semiconductor pillar 20 or when the electric charges accumulated in the charge storage layer 32 diffuse to the semiconductor pillar 20. The tunnel layer 33 is, for example, a silicon oxide layer.

Further, as shown in FIG. 3, each of the conductive layers WL includes a first portion P1, a second portion P2, and a third portion P3. The second portion P2 is provided on the first portion P1. The third portion P3 is provided between the first portion P1 and the second portion P2 in the Z-direction.

The first portion P1 and the second portion P2 include first element.

The third portion P3 includes a second element selected from at least one of carbon, nitrogen, oxygen, and germanium. The first portion P1 and the second portion P2 may include the second element in addition to the first element. The third portion P3 may include first element in addition to the second element.

Figure 4:
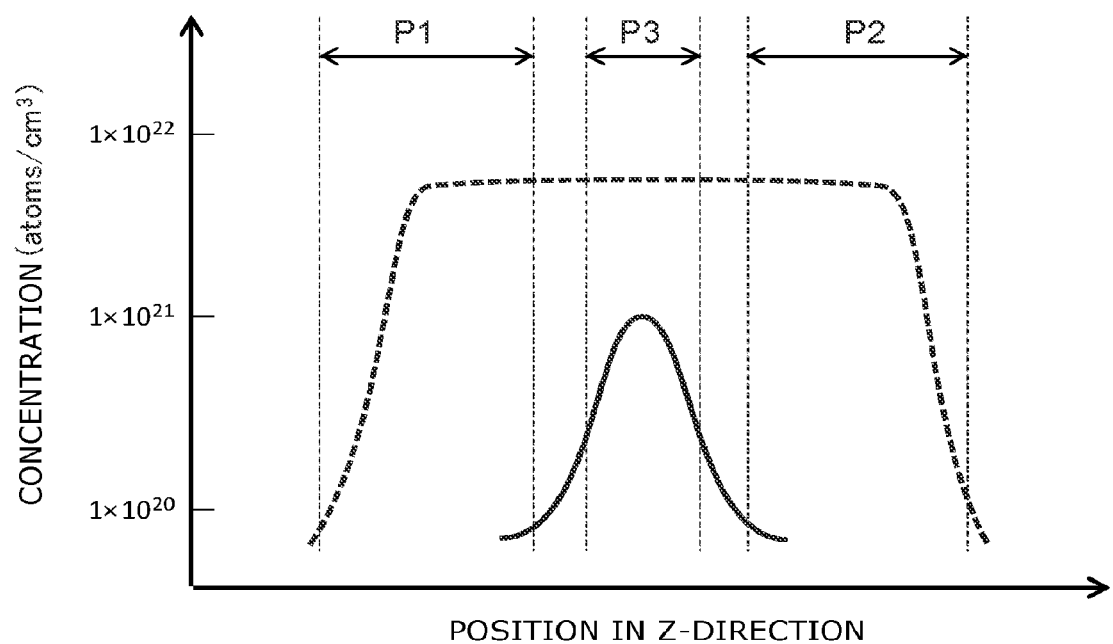
FIGS. 4 to 7B are examples of first element concentrations and second element concentrations in the first portion P1 to the third portion P3.

An example of the first element concentration and the second element concentration in the first portion P1 to the third portion P3 is shown in FIG. 4. In FIG. 4, the abscissa represents a position in the Z-direction and the ordinate represents a concentration. A solid line represents the concentration of the second element. A broken line represents the concentration of the first element.

As shown in FIG. 4, the maximum of the first element concentration is, for example, higher than the maximum of the second element concentration in all of the first portion P1 to the third portion P3. The maximum of the second element concentration in the third portion P3 is higher than the maximum of the second element concentration in the first portion P1 and the maximum of the second element concentration in the second portion P2. In the third portion P3, the maximum of the second element concentration is, for example, lower than the maximum of the first element concentration.

Other examples of the first element concentrations and the second element concentrations in the first portion P1 to the third portion P3 are shown in FIGS. 5A to 7B. In FIGS. 5A to 7B, as in FIG. 4, the abscissa represents a position in the Z-direction and the ordinate represents concentration. A solid line represents the concentration of the second element and a broken line represents the concentration of the first element.

Figure 5A:
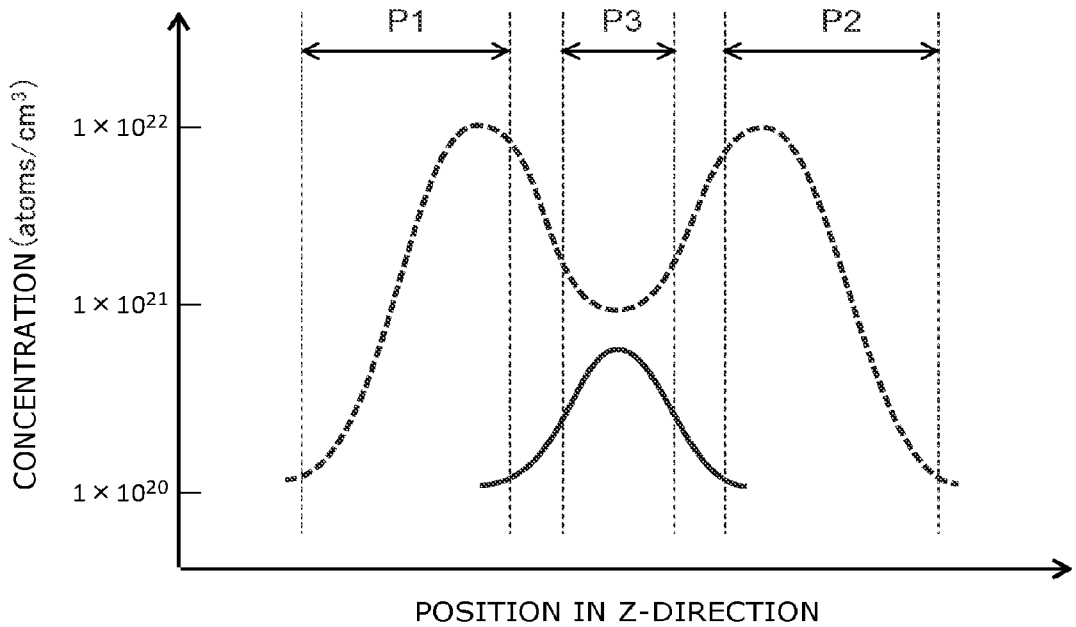
Figure 5B:
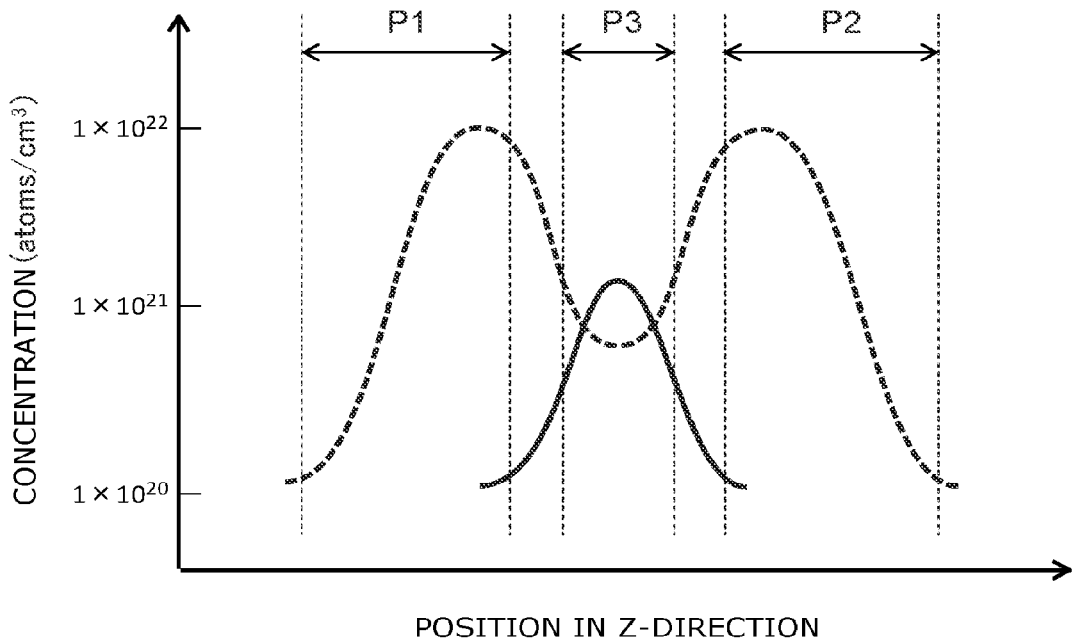

As shown in FIGS. 5A and 5B, the maximum of the first element concentration in the third portion P3 may be lower than the maximum of the first element concentration in the first portion P1 and the maximum of the first element concentration in the second portion P2.

In the example shown in FIG. 5A, in the third portion P3, the minimum of the first element concentration is higher than the maximum of the second element concentration. As shown in FIG. 5B, in the third portion P3, the minimum of the first element concentration may be lower than the maximum of the second element concentration.

Figure 6A:
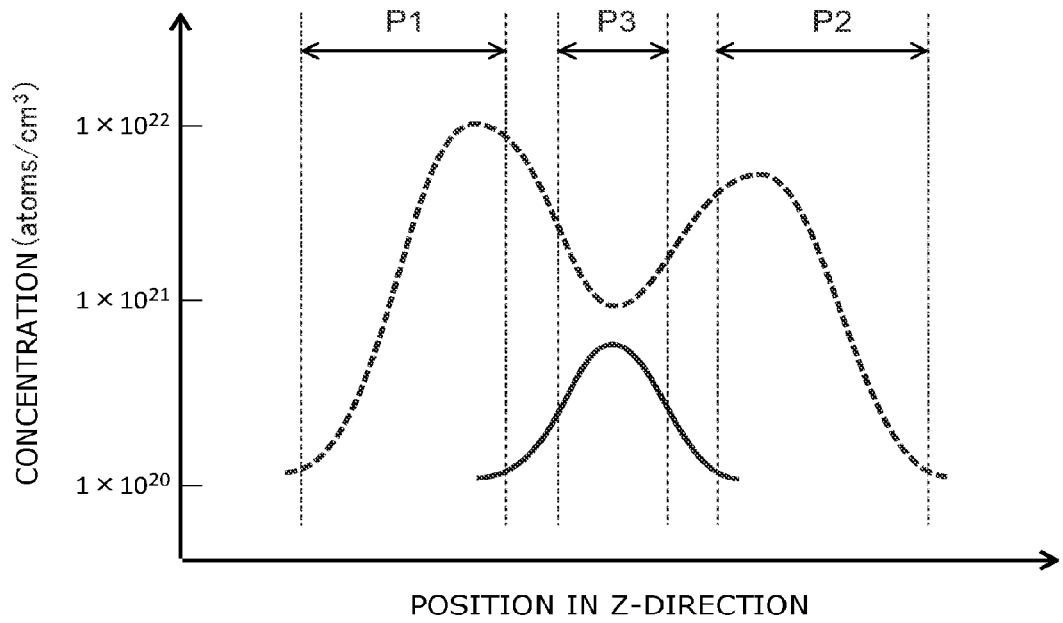

As shown in FIG. 6A, the maximum of the first element concentration in the first portion P1 may be higher than the maximum of the first element concentration in the second portion P2. Or, as shown in FIG. 6B, the maximum of the first element concentration in the second portion P2 may be higher than the maximum of the first element concentration in the first portion P1.

Figure 6B:
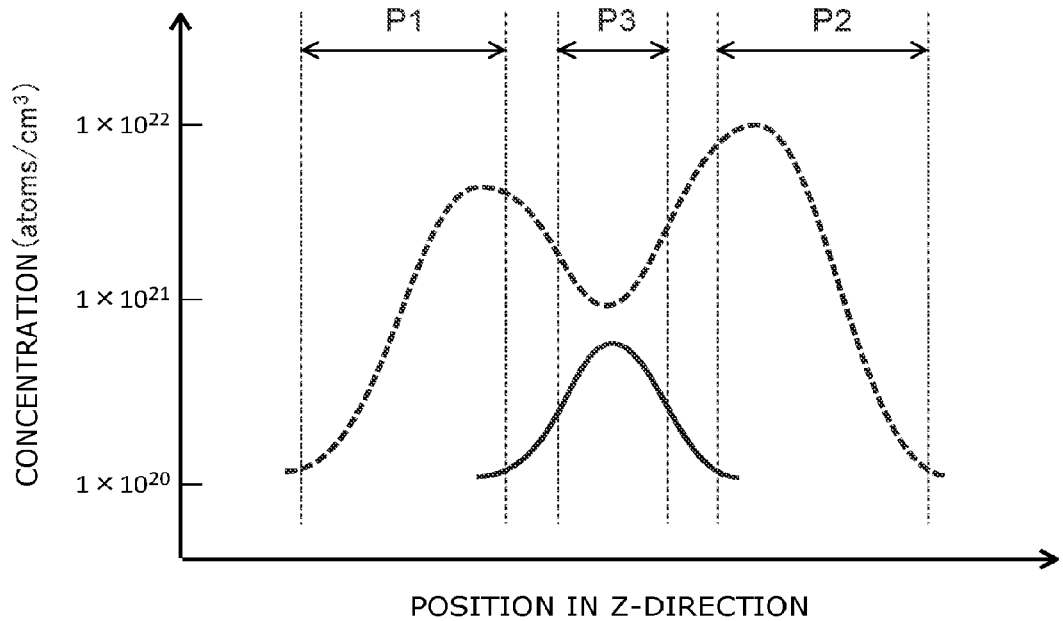

In the examples shown in FIGS. 6A and 6B, the maximum of the first element concentration in the third portion P3 is lower than the maximum of the first element concentration in the first portion P1 and the maximum of the first element concentration in the second portion P2.

Figure 7A:
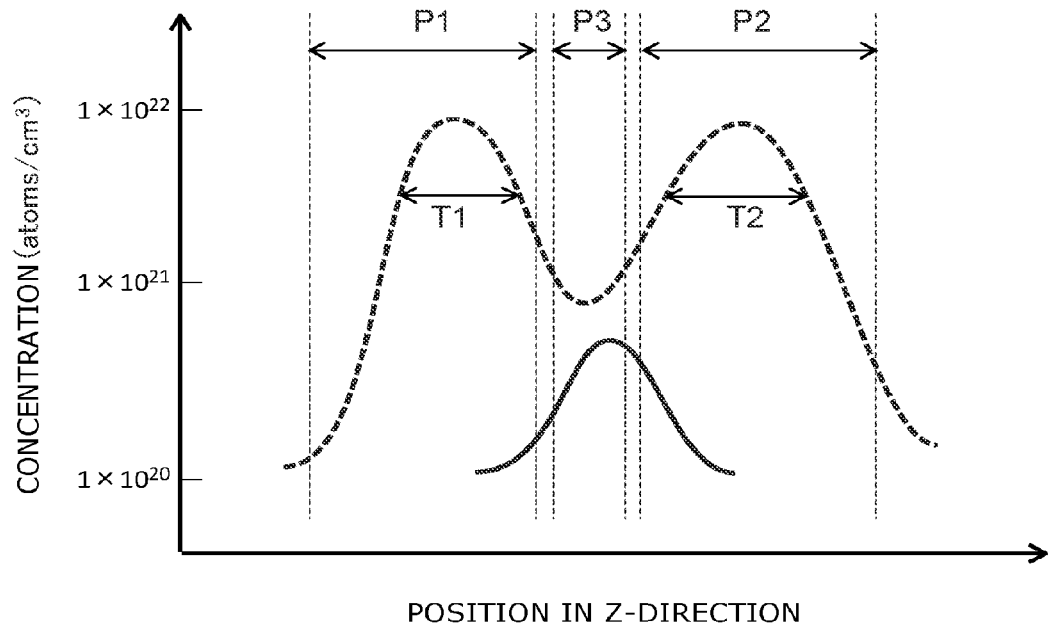

Thickness T2 in the Z-direction of a region where the first element having concentration not less than predetermined concentration are added in the second portion P2 may be, for example, as shown in FIG. 7A, larger than thickness T1 in the Z-direction of a region where the first element having concentration not less than the predetermined concentration are added in the first portion P1. The thickness T1 and the thickness T2 are, for example, thicknesses in the Z-direction of regions where the first element having concentration not less than a half of a higher one of the maximum of the first element concentration in the first portion P1 and the maximum of the first element concentration in the second portion P2 are added in the first portion P1 and the second portion P2.

In this case, a point having the maximum of the second element concentration is, for example, as shown in FIG. 7A, located between a point having the minimum of the first element concentration in the third portion P3 and a point having the maximum of the first element concentration in the second portion P2.

Figure 7B:
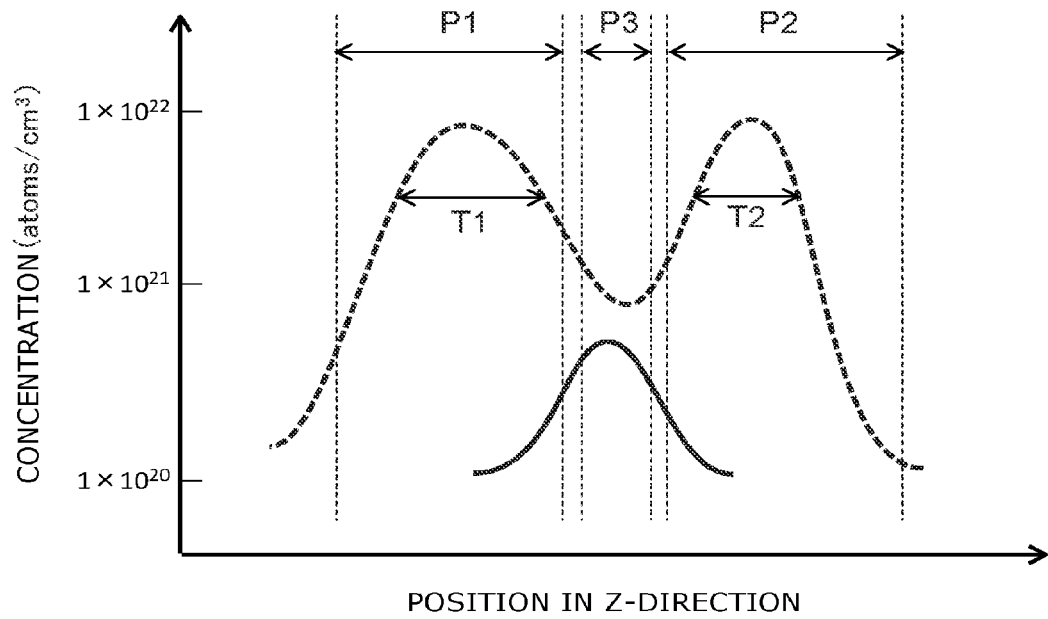

The thickness T1 may be larger than the thickness T2 as shown in FIG. 7B. In this case, a point having the maximum of the second element concentration is, for example, as shown in FIG. 7B, located between a point having the minimum of the first element concentration in the third portion P3 and a point having the maximum of the first element concentration in the first portion P1.

In the examples shown in FIGS. 6A to 7B, the minimum of the first element concentration in the third portion P3 may be lower than the maximum of the second element concentration in the third portion P3.

An example of a manufacturing method for the semiconductor device according to the first embodiment is described with reference to FIGS. 8A to 10B. FIGS. 8A to 10B are process sectional views showing the example of the manufacturing method for the semiconductor device according to the first embodiment. Like FIG. 1, FIGS. 8A to 10B show cross sections along the X-direction.

Note that, in FIGS. 9A to 10B, the substrate 10 and the insulating layer 40 are not shown.

Figure 8A:
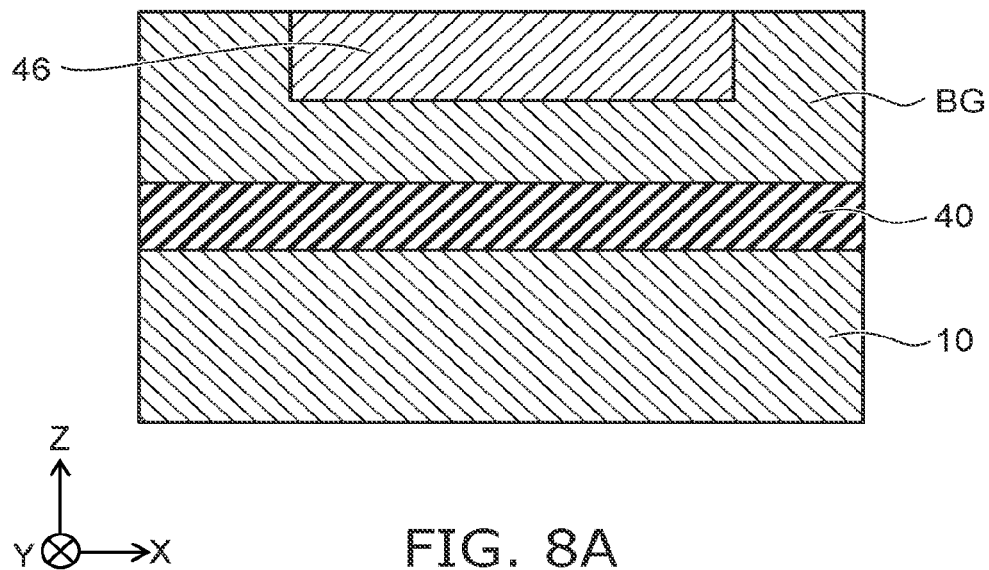
FIGS. 8A to 10B are process sectional views showing the example of the manufacturing method for the semiconductor device according to the first embodiment.

The insulating layer 40 and the back gate BG are formed on the substrate 10. A groove is formed in the back gate BG using a photolithography method and an RIE (Reactive Ion Etching) method. As shown in FIG. 8A, a sacrificial layer 46 is formed on the inside of the groove. The sacrificial layer 46 is, for example, a non-doped silicon layer.

Figure 8B:
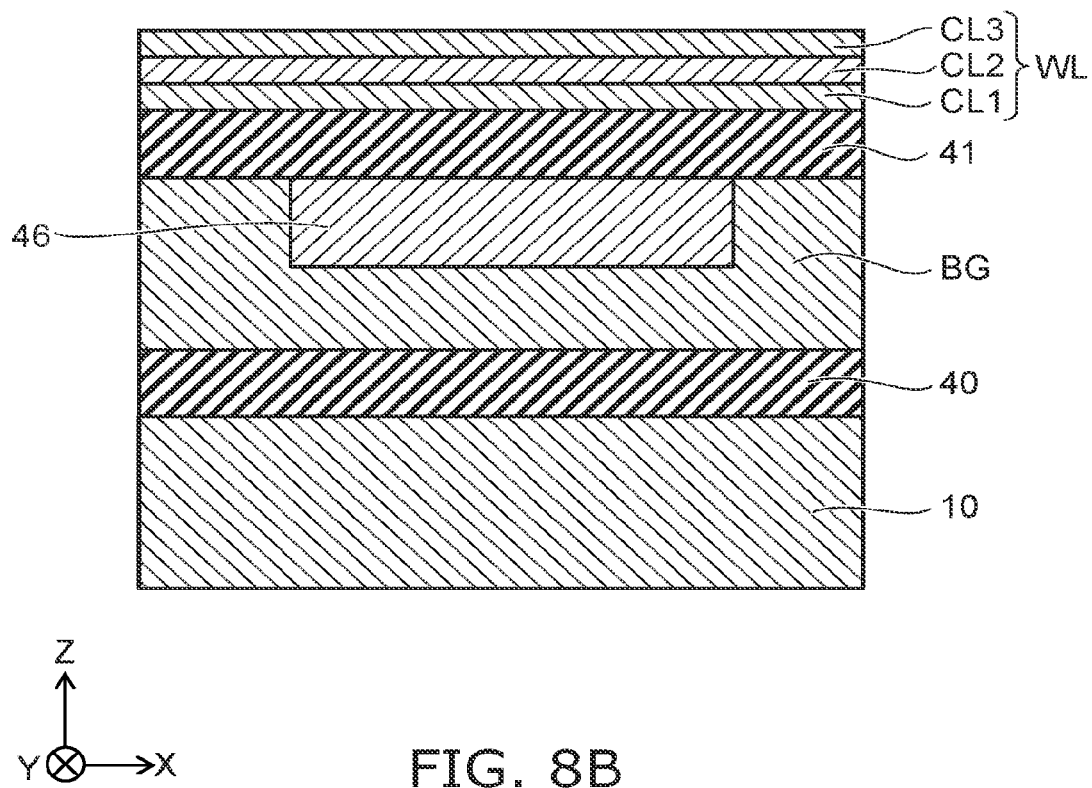

The insulating layer 41 is formed on the back gate BG and the sacrificial layer 46. As shown in FIG. 8B, a first conductive layer CL1, a second conductive layer CL2, and a third conductive layer CL3 are formed to form the conductive layer WL on the insulating layer 41.

The first conductive layer CL1 to the third conductive layer CL3 include polycrystalline silicon. The first conductive layer CL1 and the third conductive layer CL3 include first element. The second conductive layer CL2 includes the second element selected from at least one of carbon, nitrogen, oxygen, and germanium.

At least a part of the first conductive layer CL1 corresponds to the first portion P1 shown in FIG. 3. Similarly, at least a part of the second conductive layer CL2 corresponds to the second portion P2 shown in FIG. 3. At least a part of the third conductive layer CL3 corresponds to the third portion P3 shown in FIG. 3.

The first conductive layer CL1 to the third conductive layer CL3 can be formed using a CVD (Chemical Vapor Deposition) method. The first conductive layer CL1 to the third conductive layer CL3 are formed by, for example, when Si is continuously grown in the same chamber, changing an introduction amount of the first element and an introduction amount of the second element into the chamber.

For example, the conductive layer WL having a distribution shown in FIG. 4 is formed by introducing the first element into the chamber from the start to the end of formation of Si on the insulating layer 41 and temporarily introducing the second element into the chamber while forming Si.

Or, the conductive layer WL having any one of distributions shown in FIGS. 5A to 7B is formed by introducing the first element into the chamber simultaneously with starting the formation of Si on the insulating layer 41, starting the introduction of the second element simultaneously with stopping the introduction of the first element, and thereafter resuming the introduction of the first element simultaneously with stopping the introduction of the second element.

Figure 9A:
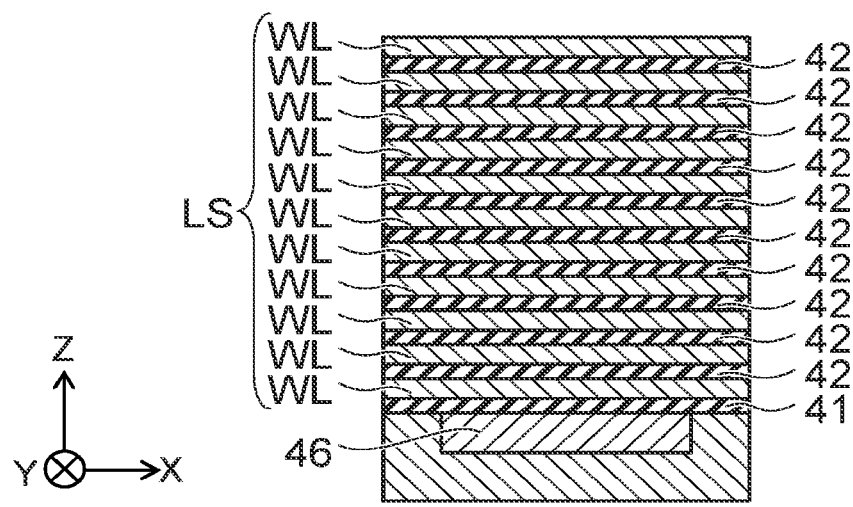

After one conductive layer WL is formed, as shown in FIG. 9A, the insulating layers 42 and the conductive layers WL are alternately formed. Each of the conductive layers WL shown in FIG. 9A can be formed by performing a process same as the process shown in FIG. 8B.

Figure 9B:
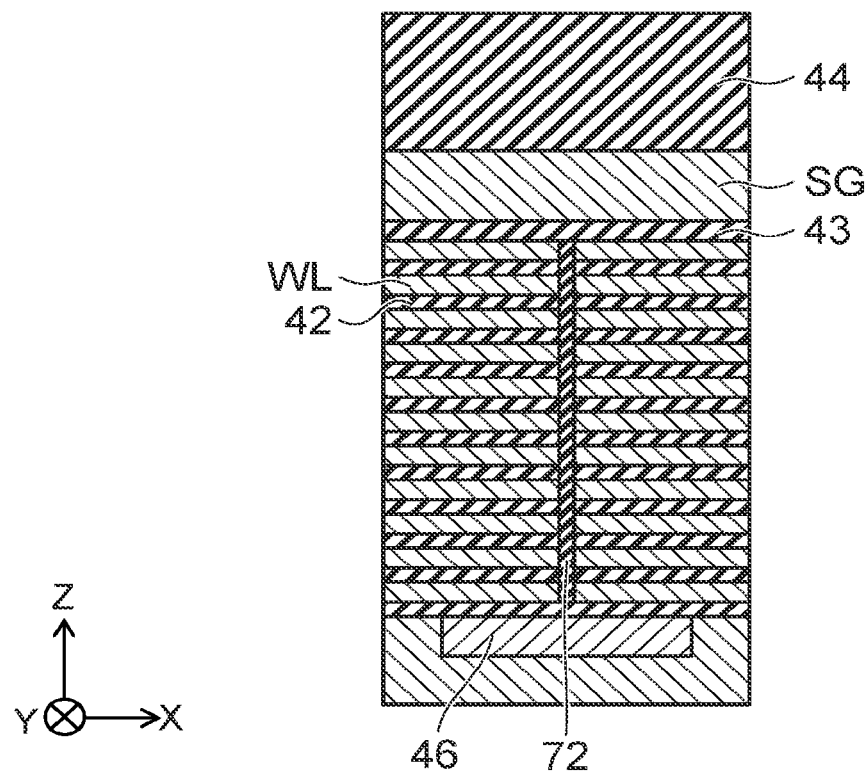

An opening is formed in the plurality of conductive layers WL and the plurality of insulating layers 42. The insulating layer 72 is formed by filling the opening with an insulating material. After the insulating layer 72 is formed, the insulating layer 43 is formed on the top conductive layer WL. A selection gate SG is formed on the insulating layer 43. Finally, a part of the selection gate SG changes to the drain side selection gate SGD. Another part of the selection gate SG changes to the source side selection gate SGS. As shown in FIG. 9B, the insulating layer 44 is formed on the selection gate SG.

Openings 53 piercing through the plurality of conductive layers WL, the plurality of insulating layers 42, the selection gate SG, and the insulating layer 44 are formed. The openings 53 are formed, for example, using the photolithography method and the RIE method. By forming the openings 53, the sidewalls of the conductive layers WL, the sidewalls of the insulating layers 42, and a part of the sacrificial layer 46 are exposed. For example, two openings 53 are formed for one sacrificial layer 46.

The sacrificial layer 46 is removed through the openings 53, for example, by wet etching. As etching liquid, an alkali chemical such as a KOH (potassium hydroxide) solution can be used.

Figure 10A:
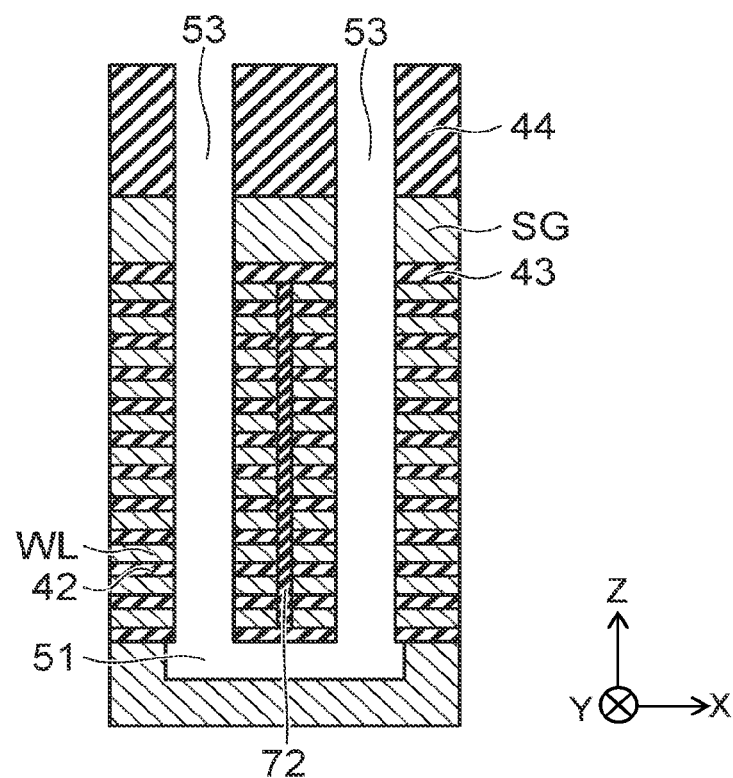

The groove 51 formed in the back gate BG in the preceding process appears through the removal of the sacrificial layer 46. According to this process, the two openings 53 formed on the one sacrificial layer 46 are connected to the common groove 51. As shown in FIG. 10A, one U-shaped memory hole MH is formed.

Figure 10B:
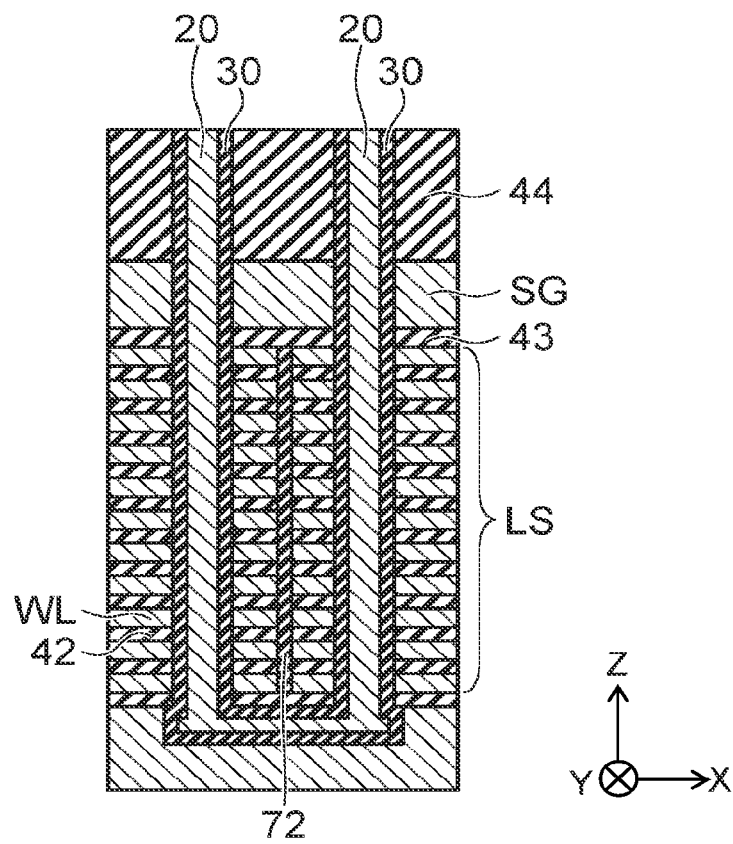

By sequentially forming the block layer 31, the charge storage layer 32, and the tunnel layer 33 on the side surfaces of the conductive layers WL, on the side surfaces of the insulating layers 42, and on the inner wall of the groove 51, the memory layers 30 are formed. By filling a semiconductor material on the inner side of the memory layers 30, as shown in FIG. 10B, the semiconductor pillars 20 are formed.

A part of the memory layers 30 and a part of the semiconductor pillars 20 are removed to form the conductors 61a. The source line SL and the bit lines BL are formed on the insulating layer 44.

According to the process described above, the semiconductor device 1 shown in FIGS. 1 to 3 is obtained.

As described above, in the embodiment, the conductive layer WL includes the first portion P1 including the first element, the second portion P2 including the first element, and the third portion P3 provided between the first portion P1 and the second portion P2 in the Z-direction and including the second element selected from at least one of carbon, nitrogen, oxygen, and germanium.

According to the embodiment, when information is stored in the memory layer 30, it is possible to reduce time until a threshold voltage is applied to the conductive layer WL. That is, according to the embodiment, writing speed in the memory layer 30 is improved. This is because, since the conductive layer WL includes the third portion P3, diffusion of the first element included in the conductive layer WL to the insulating layers 42 is suppressed.

When the first element included in the conductive layer WL diffuse to the insulating layers 42, in a state in which a voltage is not applied to the conductive layer WL, a depleted region expands in the conductive layer WL. When the depleted region expands in the conductive layer WL, time from the start of the voltage application to the conductive layer WL until the voltage is actually applied to the conductive layer WL increases. Therefore, a decrease in the writing speed in the memory layer 30 occurs.

On the other hand, since diffusion of boron included in the conductive layer WL to the insulating layers 42 is suppressed, it is possible to suppress expansion of the depleted region in the conductive layer WL. As a result, the writing speed in the memory layer 30 is improved.

When boron is used as the first element, it is desirable that the third portion P3 includes carbon. When the third portion P3 includes carbon, it is possible to preferably suppress the diffusion of boron to the insulating layers 42.

Similarly, when phosphorus is used as the first element, it is desirable that the third portion P3 includes carbon. When the third portion P3 includes carbon, it is possible to preferably suppress the diffusion of phosphorus to the insulating layers 42.

Second Embodiment

Figure 11:
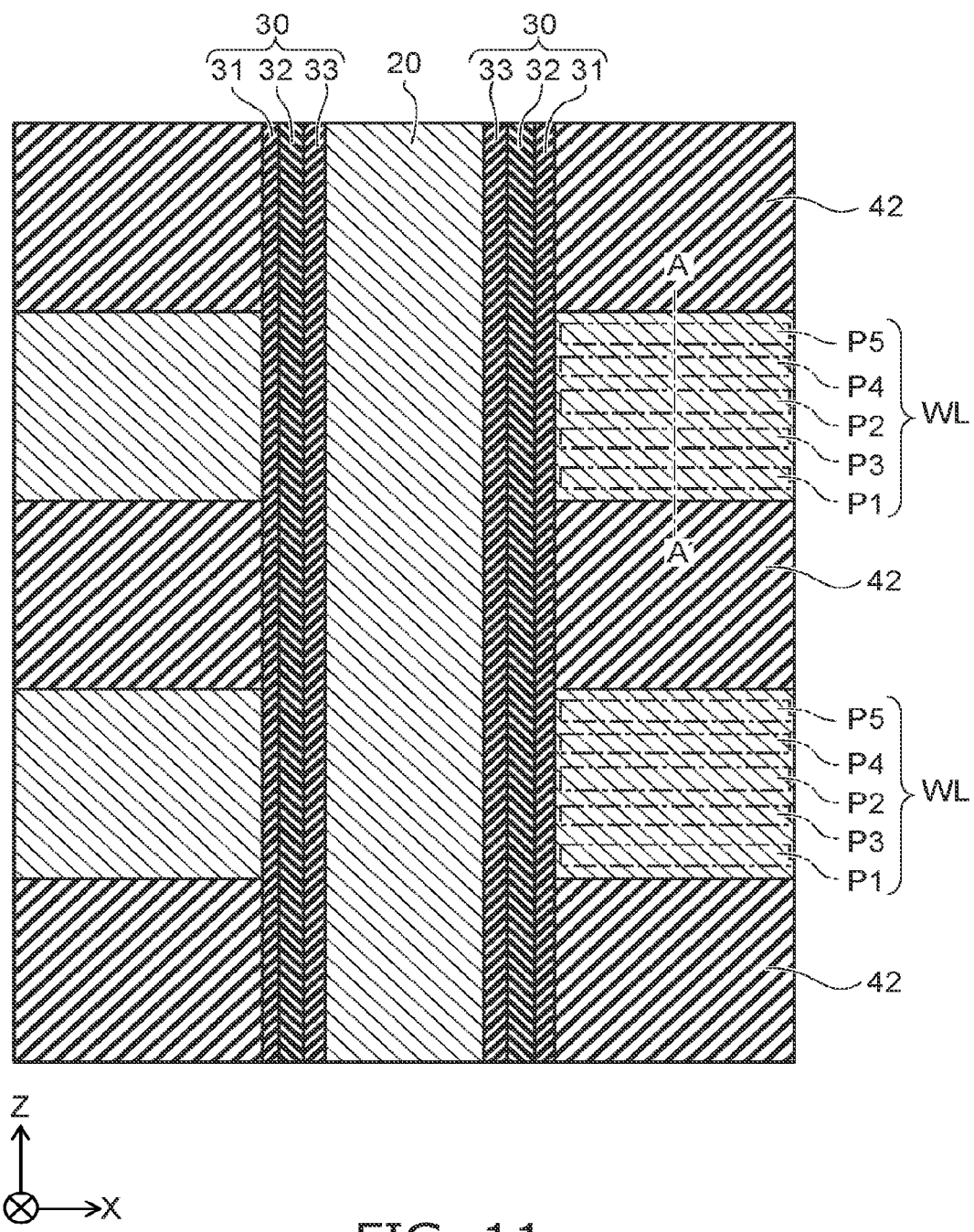
FIG. 11 is a partially enlarged sectional view of a semiconductor device 2 according to a second embodiment.

FIG. 11 is a partially enlarged sectional view of a semiconductor device 2 according to a second embodiment.

The semiconductor device 2 is different from the semiconductor device 1, for example, concerning the structure of the conductive layer WL. A configuration same as the configuration of the semiconductor device 1 can be adopted concerning a configuration other than the conductive layer WL in the semiconductor device 2.

As shown in FIG. 11, the conductive layer WL includes the first portion P1, the second portion P2, the third portion P3, a fourth portion P4, and a fifth portion P5. The third portion P3 is located between the first portion P1 and the second portion P2 in the Z-direction. The second portion P2 is located between the third portion P3 and the fourth portion P4 in the Z-direction. The fourth portion P4 is located between the second portion P2 and the fifth portion P5 in the Z-direction.

The first portion P1, the second portion P2, and the fifth portion P5 include the first element. The third portion P3 and the fourth portion P4 include the second element.

The first portion P1, the second portion P2, and the fifth portion P5 may include the second element. The third portion P3 and the fourth portion P4 may include the first element.

Examples of the first element concentrations and the second element concentrations in the first portion P1 to the fifth portion P5 are shown in FIGS. 12 to 15B. In FIGS. 12 to 15B, the abscissa represents a position in the Z-direction and the ordinate represents concentration. A solid line represents the concentration of the second element. A broken line represents the first element concentration.

Figure 12:
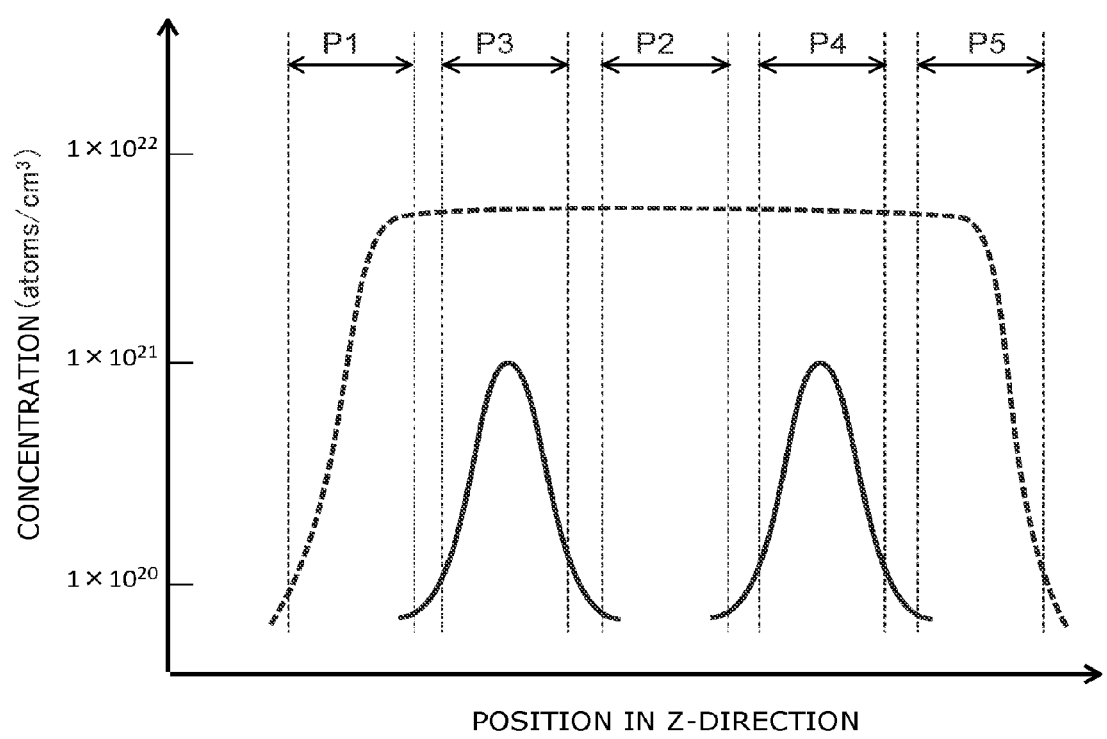
FIGS. 12 to 15B are examples of first element concentrations and first element concentrations in the first portion P1 to the fifth portion P5

The maximum of the first element concentration is, for example, as shown in FIG. 12, higher than the maximum of the second element concentration in all of the first portion P1 to the fifth portion P5. The maximum of the second element concentration in the third portion P3 and the maximum of the second element concentration in the fourth portion P4 are higher than the maximum of the second element concentration in the first portion P1, the maximum of the second element concentration in the second portion P2, and the maximum of the second element concentration in the fifth portion P5. In the third portion P3, the maximum of the second element concentration is, for example, lower than the maximum of the first element concentration. Similarly, in the forth portion P4, the maximum of the second element concentration is, for example, lower than the maximum of the first element concentration.

Figure 13A:
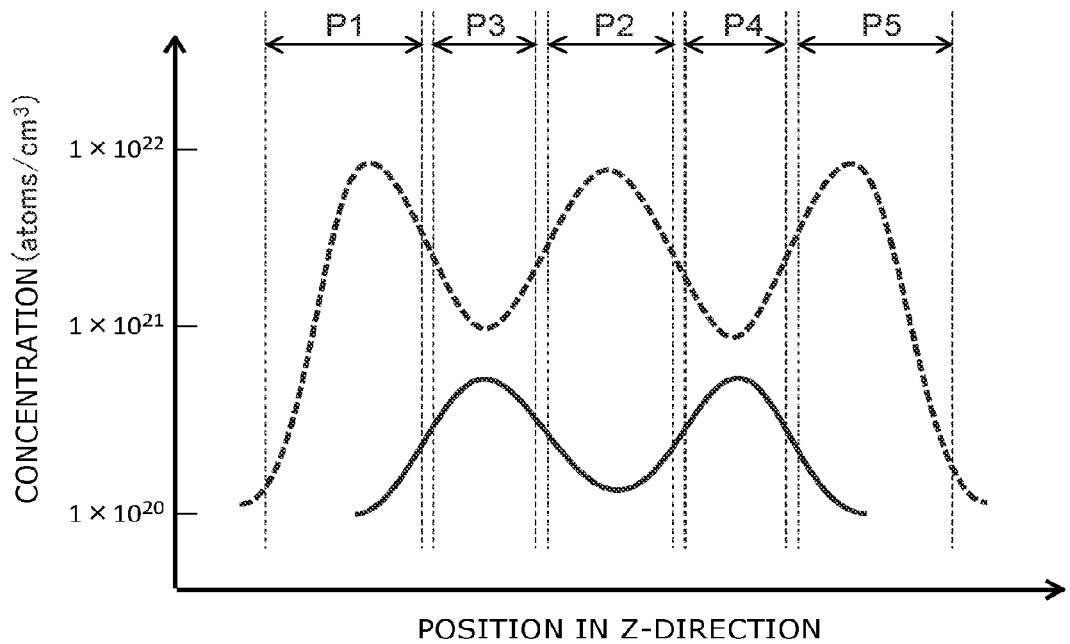
Figure 13B:
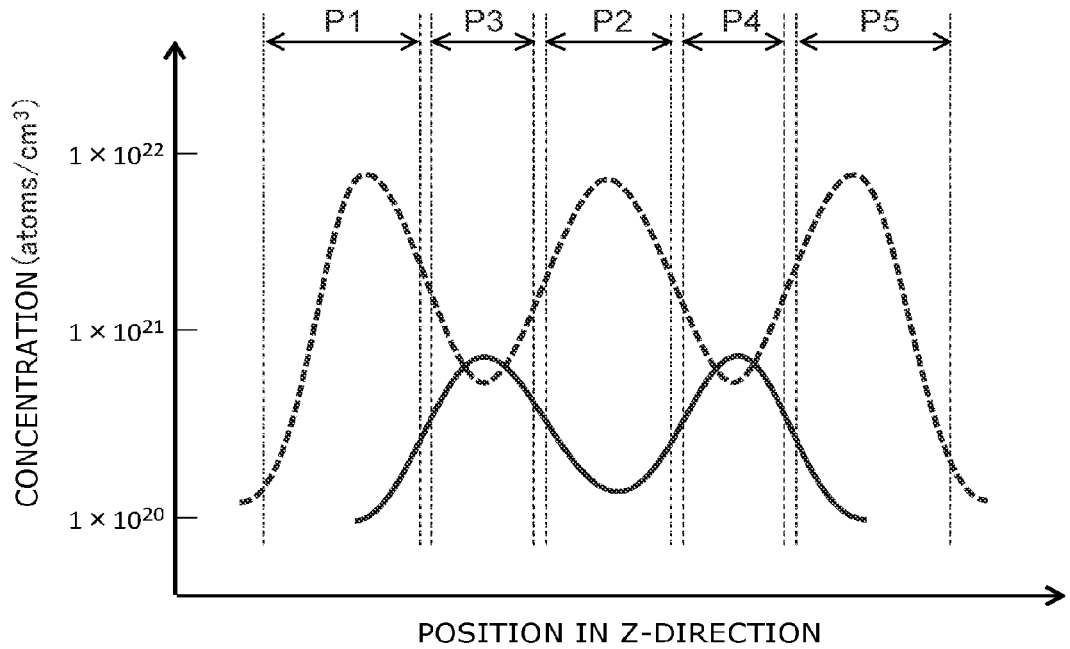

As shown in FIGS. 13A and 13B, the maximum of the first element concentration in the third portion P3 may be lower than the maximum of the first element concentration in the first portion P1 and the maximum of the first element concentration in the second portion P2. Similarly, the maximum of the first element concentration in the fourth portion P4 may be lower than the maximum of the first element concentration in the second portion P2 and the maximum of the first element concentration in the fifth portion P5.

In the third portion P3, the minimum of the first element concentration may be higher than the maximum of the concentration of the second element as shown in FIG. 13A and may be lower than the maximum of the second element concentration as shown in FIG. 13B. Similarly, in the forth portion P4, the minimum of the first element concentration may be higher than or may be lower than the maximum of the second element concentration.

Figure 14A:
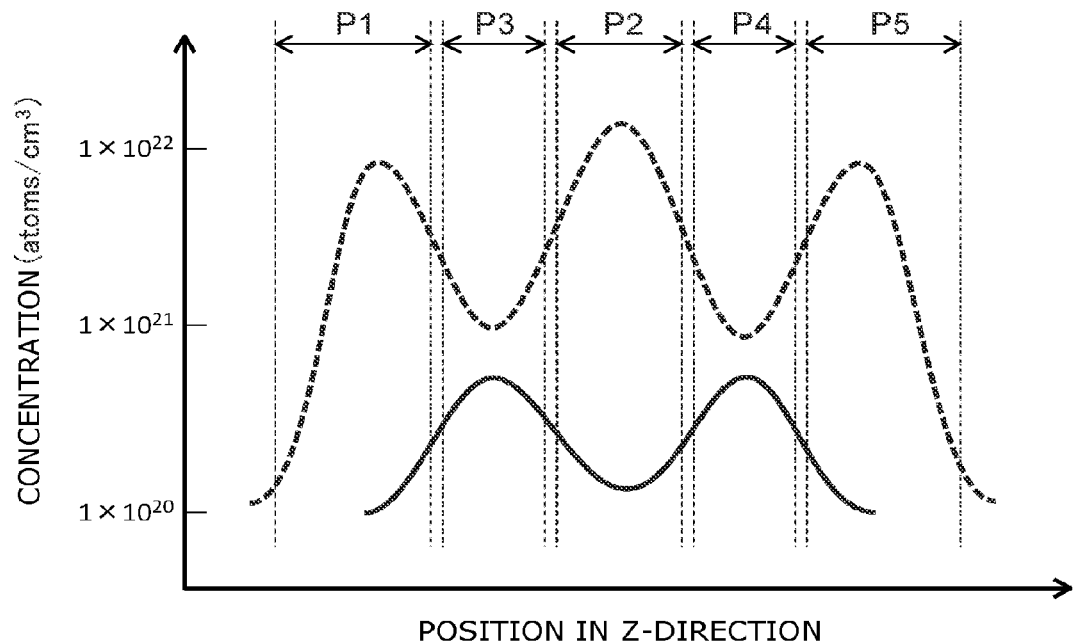
Figure 14B:
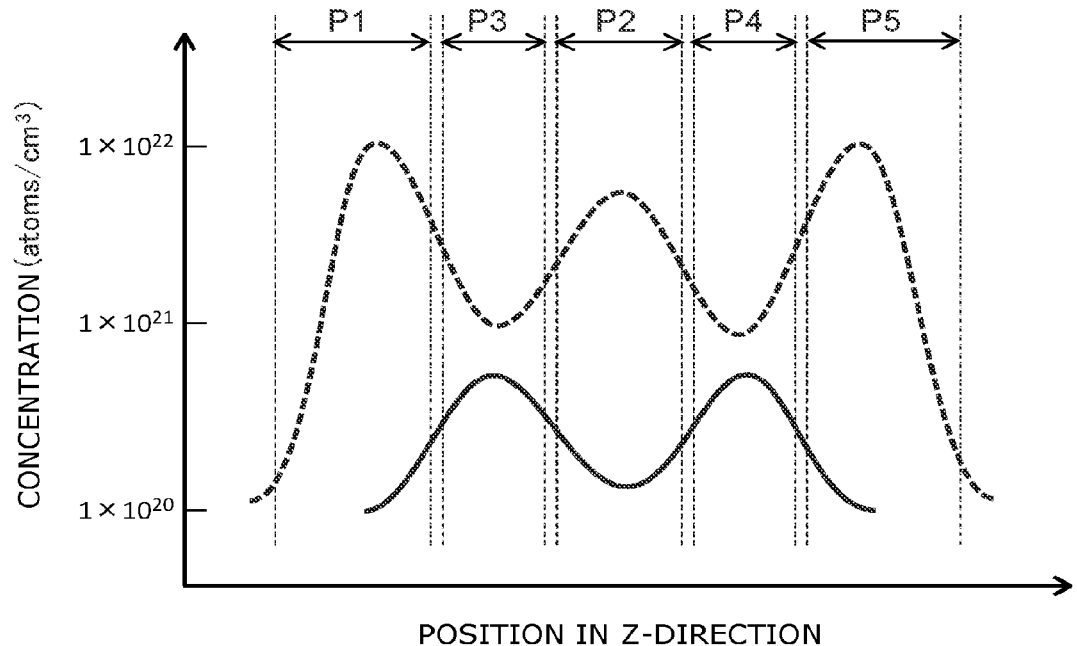

The maximum of the first element concentration in the second portion P2 is, for example, as shown in FIG. 14A, higher than the maximum of the first element concentration in the first portion P1 and the maximum of the first element concentration in the fifth portion P5. The maximum of the first element concentration in the second portion P2 may be, as shown in FIG. 14B, lower than the maximum of the first element concentration in the first portion P1 and the maximum of the first element concentration in the fifth portion P5.

Or, one of the maximum of the first element concentration in the first portion P1 and the maximum of the first element concentration in the fifth portion P5 may be higher than the maximum of the first element concentration in the second portion P2. The other may be lower than the maximum of the first element concentration in the second portion P2.

Figure 15A:
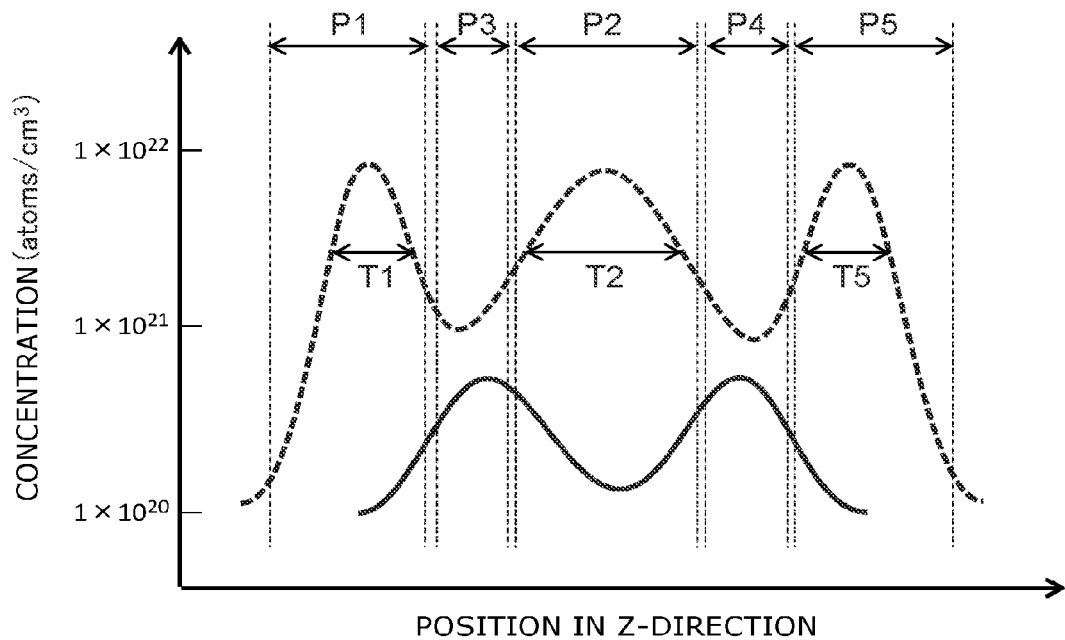

The thickness T2 in the Z-direction of a region where the first element having concentration not less than predetermined concentration are added in the second portion P2 may be, for example, as shown in FIG. 15A, larger than the thickness T1 in the Z-direction of a region where the first element having concentration not less than the predetermined concentration are added in the first portion P1. Similarly, the thickness T2 is, for example, as shown in FIG. 15A, larger than thickness T5 in the Z-direction of a region where the first element having concentration not less than the predetermined concentration are added in the fifth portion P5.

The thickness T1, the thickness T2, and the thickness T5 are, for example, thicknesses in the Z-direction of regions where the first element having concentration not less than a half of a highest one of the maximum of the first element concentration in the first portion P1, the maximum of the first element concentration in the second portion P2, and the maximum of the first element concentration in the fifth portion P5 are added in the first portion P1, the second portion P2, and the fifth portion P5.

Figure 15B:
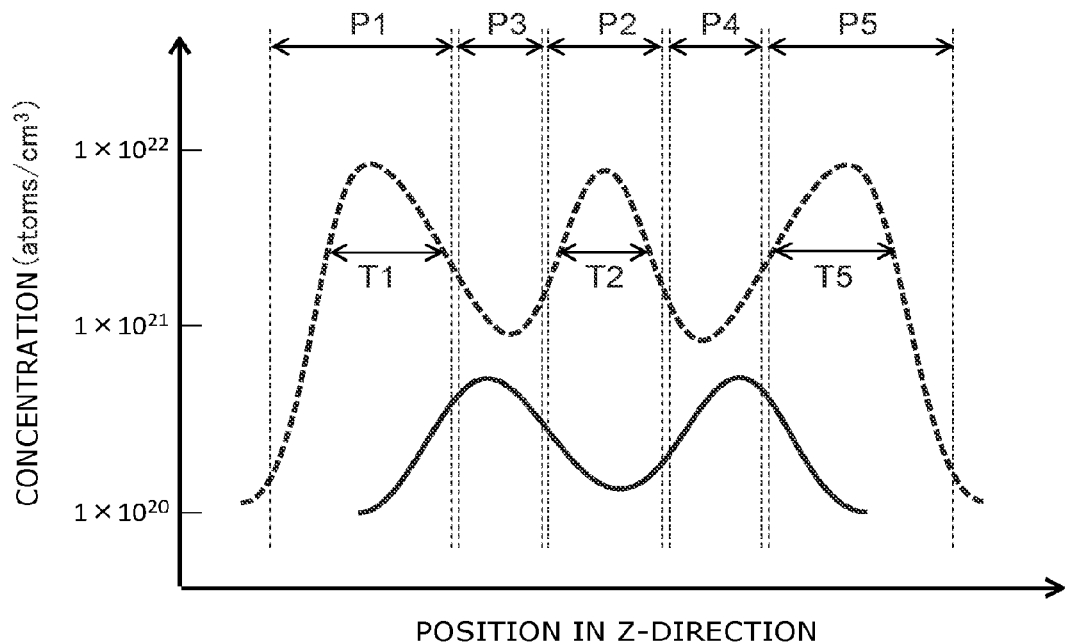

As shown in FIG. 15B, the thickness T2 may be smaller than the thickness T1 and the thickness T5.

In the examples shown in FIGS. 12 to 15B, the maximum of the second element concentration in the third portion P3 may be equal to or may be different from the maximum of the second element concentration in the fourth portion P4.

According to the second embodiment, the conductive layer WL includes the fourth portion P4 and the fifth portion P5 in addition to the first portion P1 to the third portion P3. Therefore, it is possible to more preferably suppress the diffusion of the first element from the conductive layer WL to the insulating layers 42 compared with the first embodiment.

Third Embodiment

Figure 16:
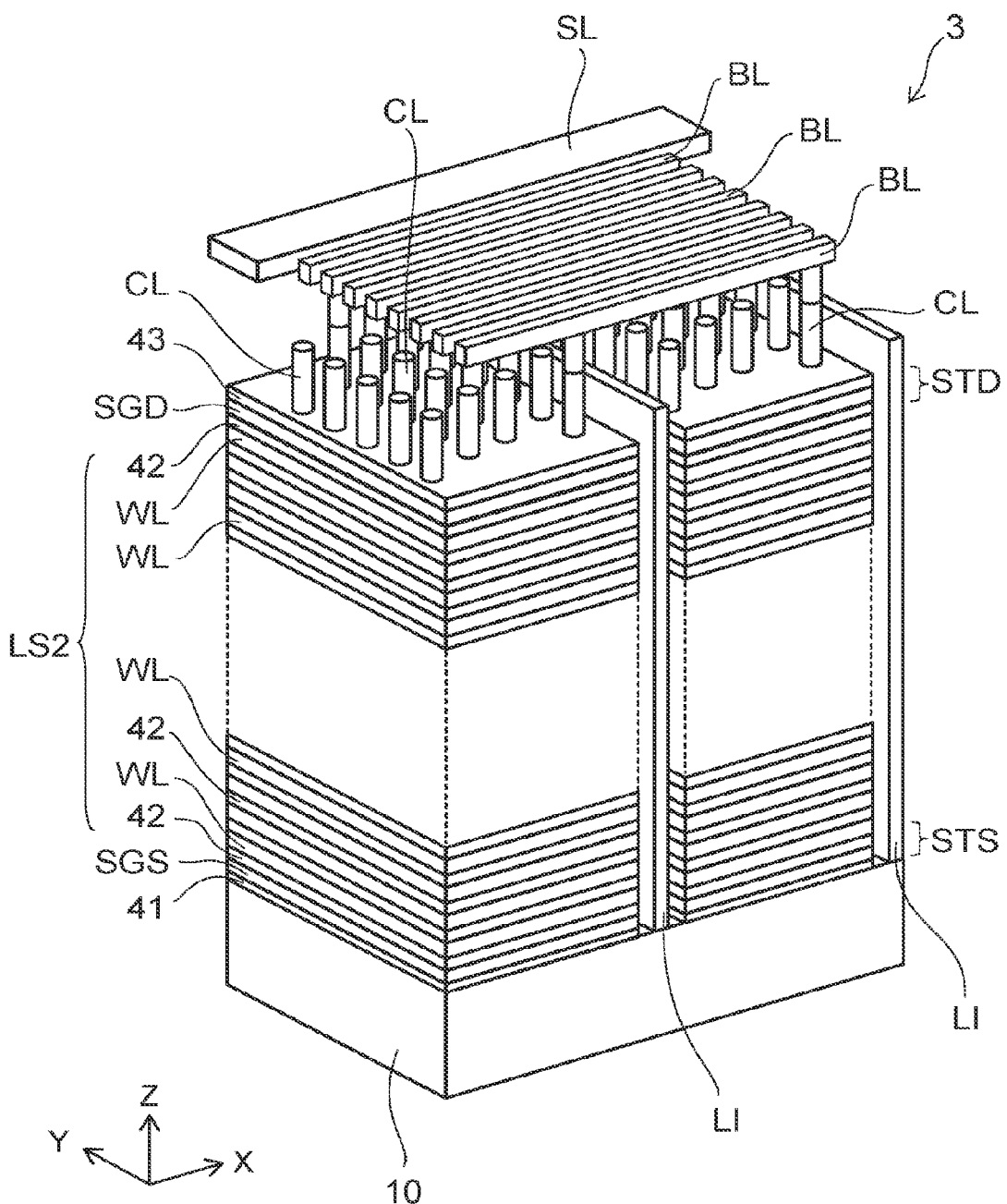
FIG. 16 is a perspective view of a semiconductor device according to a third embodiment.

FIG. 16 is a perspective view of a semiconductor device according to a third embodiment.

As shown in FIG. 16, a semiconductor device 3 includes the substrate 10, a stacked body LS2, the plurality of columnar sections CL, and an interconnect section LI, and an upper layer interconnect. FIG. 16 shows the bit line BL and the source line SL as the upper layer interconnect.

The source side selection gate SGS is provided on the substrate 10 with the insulating layer 41 interposed. The stacked body SL2 is provided on the source side selection gate SGS. The stacked body LS2 includes the plurality of conductive layers WL, and the plurality of insulating layers 42. The insulating layer 41, the source side selection gate SGS, and the insulating layers 42 form the source side selection transistor STS. The insulating layer 43 is provided on the drain side selection gate SGD. The insulating layers 42, the drain side selection gate SGD. and the insulating layer 43 forms the drain side selection transistor STD.

The plurality of columnar sections CL extending in the Z-direction are provided in the stacked body LS2. The columnar sections CL include, for example, the semiconductor pillar 20 and the memory layer 30 as well as the first embodiment. The plurality of columnar sections CL, for example, are arranged in zigzag along the X-direction and the Y-direction. Alternately, the plurality of columnar sections CL may be arranged in a square lattice-like along the X-direction and the Y-direction. The columnar sections CL are electrically connected to the substrate 10.

The interconnect section LI extends in the X-direction and the Y-direction between the adjacent stacked bodies LS2. An insulating layer is provided between the interconnect section LI and the stacked body LS2. An end portion of the interconnect section LI is electrically connected to the semiconductor pillar 20 in the columnar section CL via the substrate 10. An upper end of the interconnect section LI is electrically connected to a peripheral circuit via an interconnect not shown. The upper end of the interconnect section LI is further electrically connected to the control circuit not shown via a contact layer.

The interconnect section LI may be provided between the substrate 10 and the stacked body LS2.

The plurality of bit lines BL are provided on the stacked body LS2. The plurality of bit lines BL are displaced from each other in the X-direction and extend in the Y-direction.

An upper end of the semiconductor pillar 20 is connected to the bit line BL shown in FIG. 16, and a lower end of the semiconductor pillar 20 is connected to the substrate 10. The respective bit lines BL extend in the Y-direction.

The drain side selection transistor STD, the source side selection transistor STS, and the plurality of conductive layers WL arranged therebetween are connected in series through the semiconductor pillar 20, and form one memory string. The memory string is arranged along the X-direction and the Y-direction, and thus a 3-dimensional memory is formed.

It is possible to apply the conductive layers WL described in the first embodiment or the second embodiment to the conductive layers WL of the semiconductor device 3 according to the embodiment. Thereby, as well as the first embodiment and the second embodiment, the writing speed in the memory layer 30 is improved.

Figure 17:
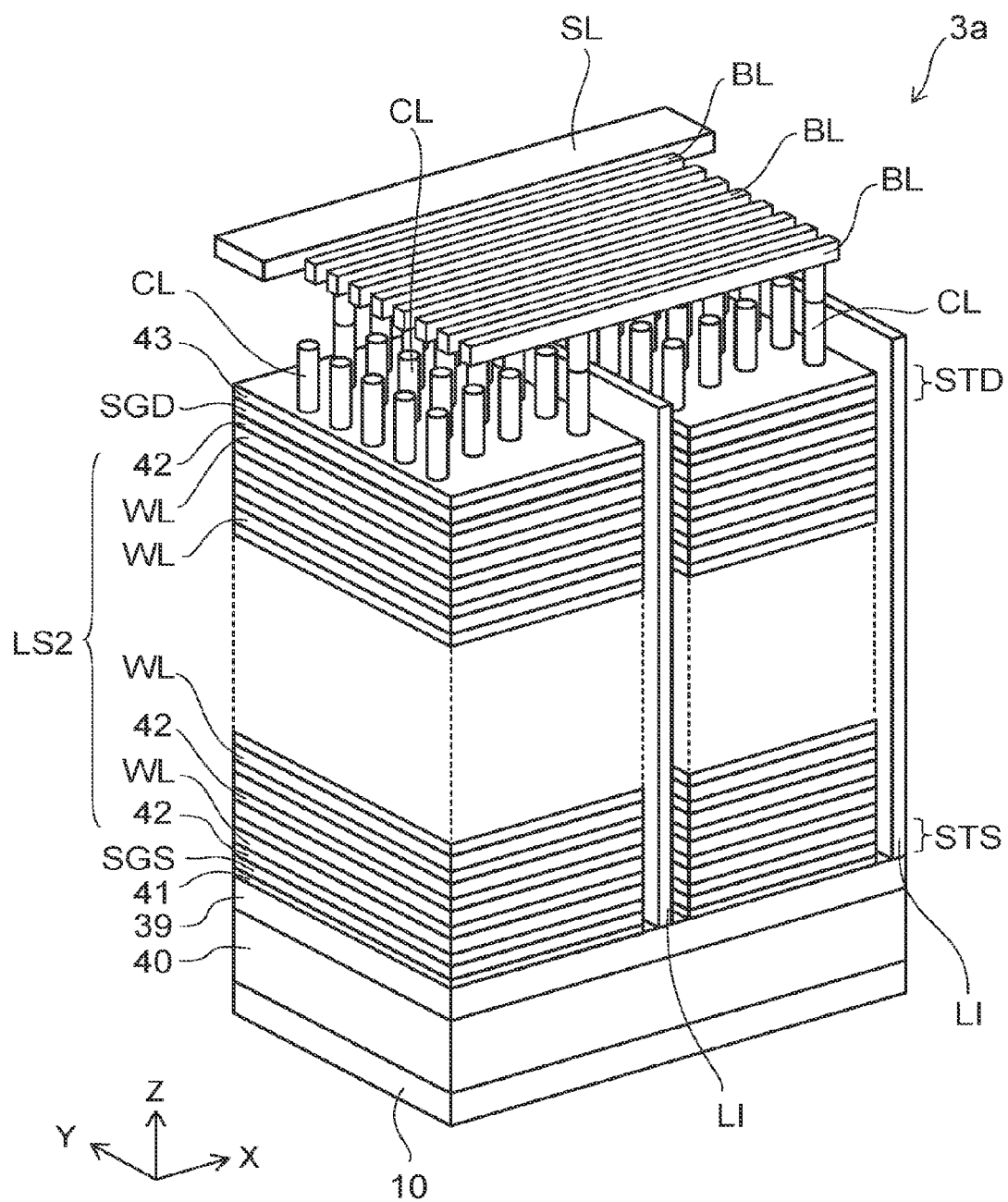
FIG. 17 is a perspective view of a semiconductor device 3a according to a variation of the third embodiment.

The semiconductor device according to the third embodiment may include the structure shown in FIG. 17 in place of the structure shown in FIG. 16.

FIG. 17 is a perspective view of a semiconductor device 3a according to a variation of the third embodiment.

The semiconductor device 3a further includes, for example, a conductive layer 39 and an insulating layer 40 in comparison with the semiconductor device 3. The insulating layer 40 is provided on the substrate 10. Circuit elements such as an interconnect layer and a transistor or the like not shown are provided in the insulating layer 40. The conductive layer 39 is provided on the insulating layer 40. The insulating layer 41 is provided on the conductive layer 39. The configuration on an upper side of the insulating layer 41 is, for example, the same as the semiconductor device 3.

A low end of the interconnect section LI is electrically connected to the semiconductor pillar 20 in the columnar section CL via the conductive layer 39. The low end of the interconnect section LI may be connected to the interconnect layer and the circuit element provided in the insulating layer 39.

Also in the variation, the writing speed in the memory layer 30 is improved.

Fourth Embodiment

Figure 18:
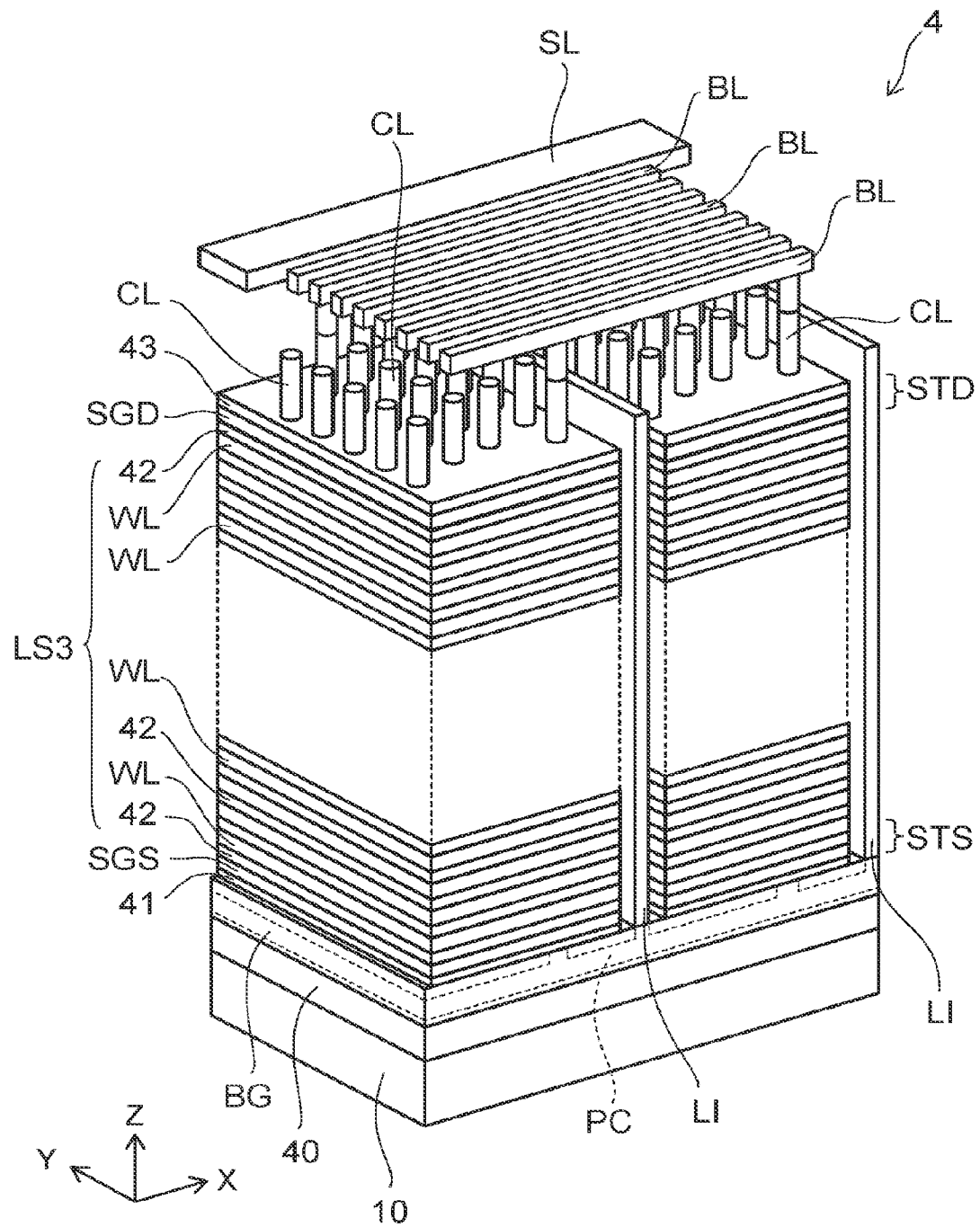
FIG. 18 is a perspective view of a semiconductor device according to a fourth embodiment.

FIG. 18 is a perspective view of a semiconductor device according to a fourth embodiment.

As shown in FIG. 19, the semiconductor device 4 includes the substrate 10, the back gate BG (conductive layer), a stacked body LS3, the plurality of columnar sections CL, the interconnect section LI, and an upper layer interconnect. FIG. 18 shows the bit line BL and the source layer SL as the upper layer interconnect.

The back gate BG is provided on the substrate 10 via the insulating layer 40. The source side selection gate SGS is provided on the back gate BG via the insulating layer 41. The stacked body LS3 is provided on the source side selection gate SGS. The stacked body LS3 includes the plurality of conductive layers WL, and the plurality of insulating layers 42. The insulating layer 41, the source side selection gate SGS, and the insulating layers 42 form the source side selection transistor STS.

The drain side selection gate SGD is provided on the stacked body LS3. The insulating layer 43 is provided on the drain side selection gate SGD. The insulating layers 42, the drain side selection gate SGD, and the insulating layer 43 form the drain side selection transistor STD.

The columnar section CL includes, for example, the semiconductor pillar 20 and the memory layer 30 similar to the first embodiment. The plurality of columnar sections CL are arranged along the X-direction and the Y-direction.

The interconnect section LI extends in the X-direction and the Y-direction between the adjacent stacked bodies LS3. A lower surface of the interconnect section LI is electrically connected to the columnar sections CL via a coupling section CP provided in the back gate BG. An upper end of the interconnect section LI is connected to the source layer SL provided on the stacked body LS3.

The coupling section CP is provided integrally with the columnar section CL, and extends in the X-direction and the Y-direction in the back gate BG. The coupling section CL is provided integrally with, for example, the plurality of columnar sections CL. Here, "provided integrally with" shows that a portion of materials used for the columnar section CL extends to the coupling section PC. Therefore, the portion of the coupling section CP is provided with the memory layer and the semiconductor pillar as well as the columnar section CL.

The plurality of bit lines BL are provided on the stacked body LS3. The plurality of bit lines BL are displace each other in the X-direction, and extend in the y-direction. The upper end of the semiconductor pillar 20 is connected to the bit line BL via the contact layer.

The drain side selection transistor STD, the source side selection transistor STS, and the plurality of conductive layers WL arranged therebetween are connected in series through the semiconductor pillar 20, and forms one memory string. The memory string is arranged along the X-direction and the Y-direction, and thus the 3-dimensional memory is formed.

It is possible to apply the conductive layers WL described in the first embodiment or the second embodiment to the conductive layers WL of the semiconductor device 4 according to the embodiment. Thereby, as well as the first embodiment and the second embodiment, the writing speed in the memory layer 30 is improved.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor device comprising:
   a stacked body including a plurality of first insulating layers and a plurality of conductive layers including silicon, the conductive layers and the first insulating layers being alternately provided, and at least one of the conductive layers including:
      a first portion including a first element selected from at least one of boron and phosphorus;
      a second portion including the first element; and
      a third portion provided between the first portion and the second portion in a stacking direction of the plurality of conductive layers and the plurality of first insulating layers and including a second element selected from at least one of carbon, nitrogen, oxygen, and germanium; and
   a semiconductor pillar piercing through the stacked body and extending in the stacking direction.

2. The device according to claim 1, further comprising a second insulating layer provided in contact with the conductive layer between the semiconductor pillar and the stacked body, wherein
the third portion is in contact with the second insulating layer.

3. The device according to claim 1, further comprising a second insulating layer provided in contact with the conductive layer between the semiconductor pillar and the stacked body, wherein
the first portion and the second portion are in contact with the second insulating layer.

4. The device according to claim 1, further comprising a second insulating layer provided in contact with the conductive layer between the semiconductor pillar and the stacked body, wherein
the first portion, the second portion, and the third portion are in contact with the second insulating layer.

5. The device according to claim 1, wherein thickness in the stacking direction of the third portion is smaller than thickness in the stacking direction of the first portion and smaller than thickness in the stacking direction of the second portion.

6. The device according to claim 1, wherein the first element is boron.

7. The device according to claim 1, wherein
the first portion and the second portion include the second element, and
a maximum of concentration of the second element in the first portion and a maximum of concentration of the second element in the second portion are lower than a maximum of concentration of the second element in the third portion.

8. The device according to claim 1, wherein a maximum of concentration of the first element in the first portion is higher than a maximum of concentration of the second element in the third portion.

9. The device according to claim 1, wherein a ratio of the second element to the silicon in the third portion is not less than 0.1% and not more than 10%.

10. The device according to claim 1, wherein
the third portion includes the first element, and
a minimum of concentration of the first element in the third portion is higher than a maximum of concentration of the second element.

11. The device according to claim 1, wherein
the third portion includes the first element, and
a maximum of concentration of the second element in the third portion is higher than a minimum of concentration of the first element.

12. The device according to claim 1, wherein
the third portion includes the first element, and
a maximum of concentration of the first element in the third portion is lower than a maximum of concentration of the first element in the first portion.

13. The device according to claim 1, wherein
the at least one conductive layer further includes:
a fourth portion including the second element, the second portion being provided between the third portion and the fourth portion in the stacking direction; and
a fifth portion including the first element, the fourth portion being provided between the second portion and the fifth portion in the stacking direction.

14. The device according to claim 13, wherein
thickness in the stacking direction of the third portion is smaller than thickness in the stacking direction of the first portion, smaller than thickness in the stacking direction of the second portion, and smaller than thickness in the stacking direction of the fifth portion, and
thickness in the stacking direction of the fourth portion is smaller than the thickness in the stacking direction of the first portion, smaller than the thickness in the stacking direction of the second portion, and smaller than the thickness in the stacking direction of the fifth portion.

* * * * *